(12) United States Patent
Imaoka et al.

(10) Patent No.: US 7,875,980 B2
(45) Date of Patent: Jan. 25, 2011

(54) SEMICONDUCTOR DEVICE HAVING LAMINATED STRUCTURE

(75) Inventors: Toshikazu Imaoka, Ogaki (JP); Ryosuke Usui, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/215,121

(22) Filed: Aug. 31, 2005

(65) Prior Publication Data
US 2006/0043606 A1   Mar. 2, 2006

(30) Foreign Application Priority Data
Sep. 1, 2004  (JP)  ............... 2004-253998

(51) Int. Cl.
*H01L 23/12*  (2006.01)
(52) U.S. Cl. ............... 257/758; 257/680; 257/E33.056; 257/700
(58) Field of Classification Search ............. 257/686, 257/758, 680, 700, E33.056, 684
See application file for complete search history.

(56) References Cited

U.S. PATENT DOCUMENTS

| | | | | |
|---|---|---|---|---|
| 5,994,771 | A * | 11/1999 | Sasaki et al. | 257/700 |
| 6,600,231 | B2 * | 7/2003 | Tominaga | 257/778 |
| 2003/0227095 | A1 * | 12/2003 | Fujisawa et al. | 257/782 |
| 2004/0031004 | A1 * | 2/2004 | Yoshioka | 716/7 |
| 2004/0119166 | A1 * | 6/2004 | Sunohara | 257/758 |
| 2004/0134681 | A1 * | 7/2004 | Tsukahara et al. | 174/255 |
| 2004/0207088 | A1 * | 10/2004 | Morozumi | 257/758 |

FOREIGN PATENT DOCUMENTS

| | | |
|---|---|---|
| JP | 63-075075 | 5/1988 |
| JP | 06-005993 | 1/1994 |
| JP | 08-162486 | 6/1996 |
| JP | 2002-094247 | 3/2002 |
| JP | 2003-142797 | 5/2003 |

OTHER PUBLICATIONS

Japanese Notification of Reason(s) for Refusal, with English translation thereof, issued in Patent Application No. JP 2004-253998 dated on Jul. 8, 2008.

* cited by examiner

*Primary Examiner*—Bradley K Smith
*Assistant Examiner*—Mohammad T Karimy
(74) *Attorney, Agent, or Firm*—McDermott Will & Emery LLP

(57) ABSTRACT

A technique for reducing the size of a semiconductor device is provided. A semiconductor device comprises a base, a semiconductor chip, a chip component, an insulating base, a wiring pattern, a via plug, an external lead-out electrode, a recess, and a resin. The insulating base has a multi-layer structure formed by laminating a plurality of insulator films. The semiconductor chip and the chip component are mounted on the base and embedded in the insulating base. A recess is formed on the surface of the semiconductor device and reaches down to any of wiring conductor layers. The semiconductor chip and the chip component are mounted on the recess.

10 Claims, 6 Drawing Sheets

100

200

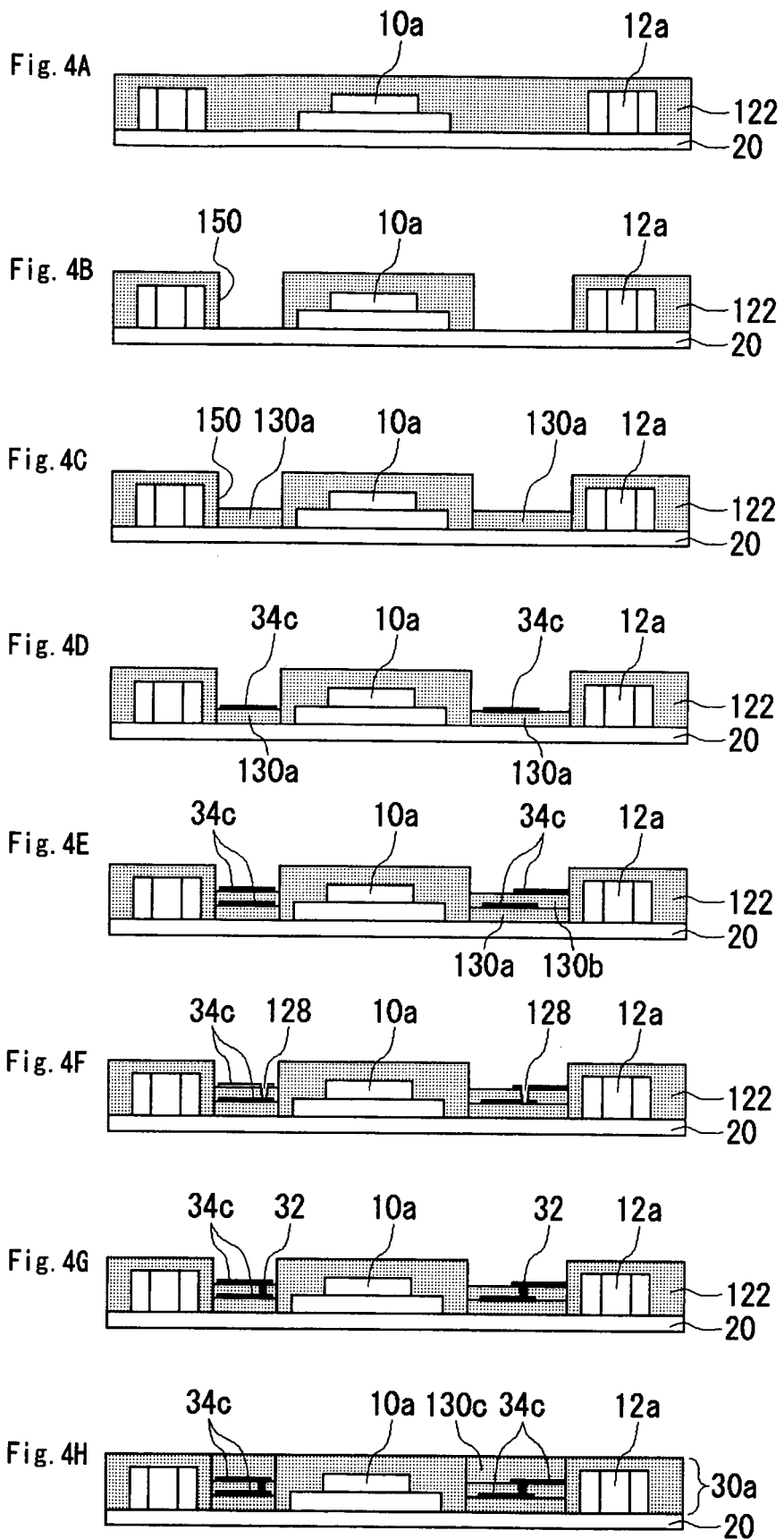

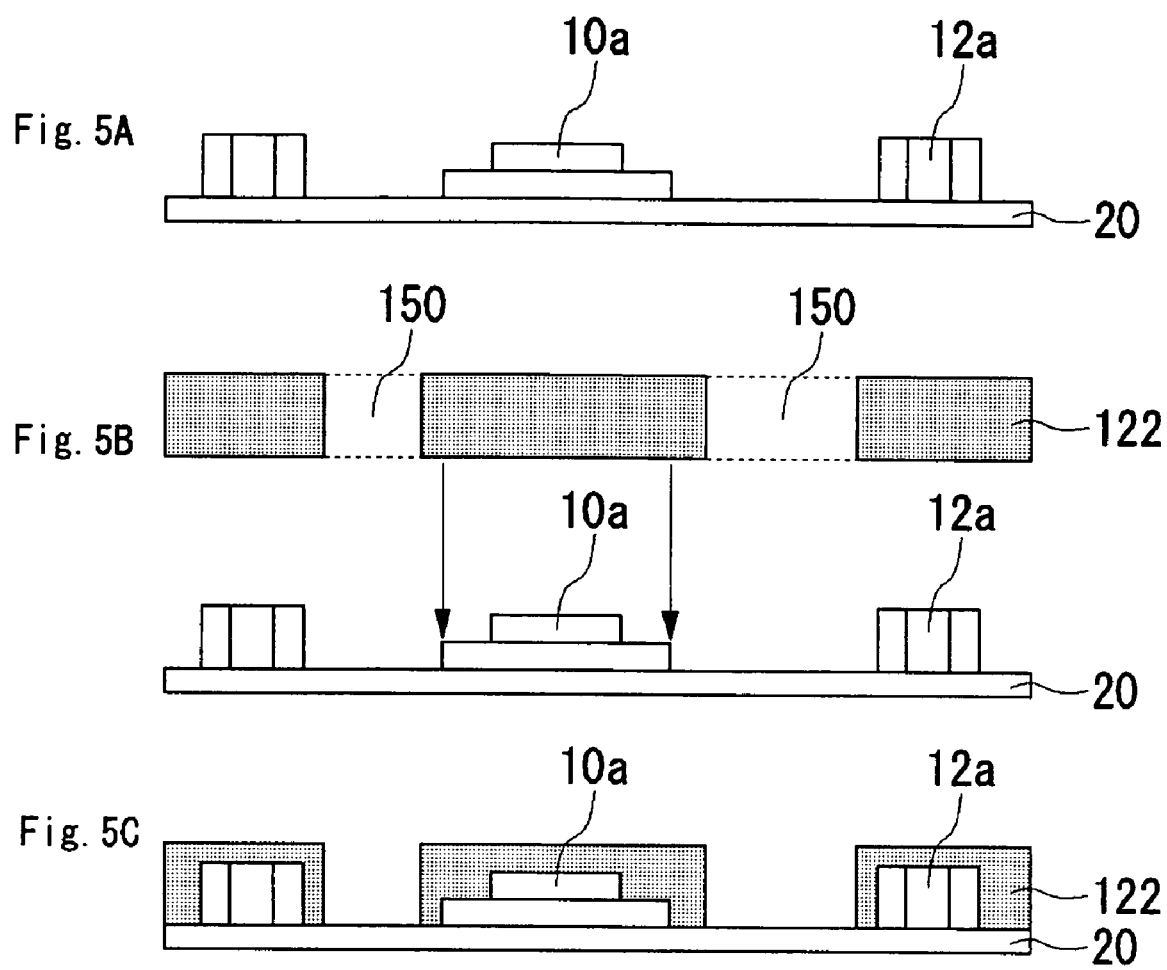

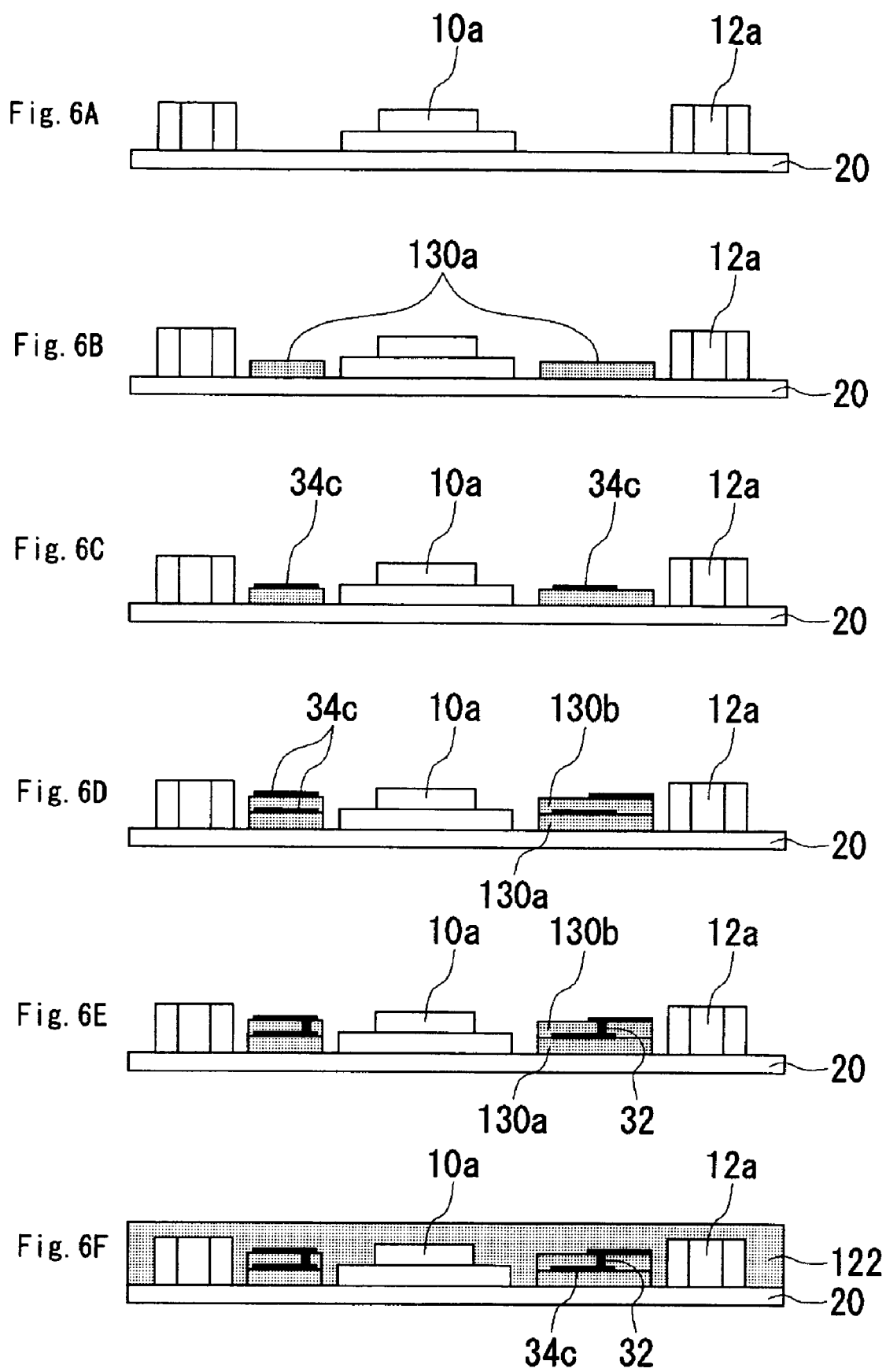

SEMICONDUCTOR DEVICE HAVING LAMINATED STRUCTURE

BACKGROUND OF THE INVENTION

1. Field of the Invention

The present invention relates to a semiconductor device and a method for manufacturing the same.

2. Description of the Related Art

Portable electronics devices such as a cellular phone, a personal digital assistance (PDA), and a digital still camera have become increasingly sophisticated in functionality. Under the circumstance, these products must be compact and lightweight in order to be accepted in the market, and a highly integrated system LSI is required for implementing such products. On the other hand, there has been a demand for electronics devices which are easier to use and more convenient, and thus higher functionality and higher performance have been required for the LSI employed in these devices. Therefore, on the one hand, the number of I/Os increases as the degree of integration increases in the LSI chip, but, on the other hand, there is a strong requirement for making the package itself more compact. In order to meet these requirements at the same time, the development of a semiconductor package suitable for mounting semiconductor components on a substrate with high density is strongly demanded. In order to address these demands, various packaging techniques referred to as a chip size package (CSP) have been developed.

A ball grid array (BGA) is an example of such a package. In the BGA, first a semiconductor chip is mounted on a substrate for packaging. After the semiconductor chip is resin-molded, solder balls serving as external terminals are formed in an array on the surface opposite to the resin-molded surface. Since a mounting area is obtained as a plane in the BGA, the size reduction of the package can be relatively easily attained. In addition, a circuit board is not required to be fine-pitch compatible, and a high accuracy mounting technique is also not required. Therefore, by employing the BGA, the total mounting cost can be reduced even when the packaging cost is somewhat expensive.

In such a package, transfer molding, injection molding, potting, dipping, or the like has been employed for sealing a semiconductor chip (see, for example, Japanese Patent Laid-Open Publication No. Hei 8-162486).

In addition, in order to implement a slim type LSI system with higher accuracy and higher functionality, a technique has been disclosed (see, for example, Japanese Patent Laid-Open Publication No. 2002-94247) in which a layer containing passive elements is formed in the upper portion of a base substrate by thin film technology and thick film technology, the passive elements including resistors, capacitors, and pattern wiring portions receiving power or a signal from the base substrate side via a dielectric insulating layer.

SUMMARY OF THE INVENTION

The problems to be solved by the present invention are in common with the above conventional technique. However, the problems are solved by a technique different from the conventional technique. An object of the present invention is to provide a technique for reducing the size of a semiconductor device.

One of the aspects of the present invention is a semiconductor device comprising: a laminated substrate formed by repeatedly laminating an insulator layer and a wiring conductor layer wherein the insulator layer located on one surface side of the laminated substrate has a recess formed therein; and a circuit element embedded in at least one of the insulator layers which is different from the insulator layer in which the recess is formed, and wherein a bottom of the recess reaches at least one of the wiring conductor layers.

According to the above aspect, a component mounting surface can be added by providing the recess in at least one of the insulator layers of the semiconductor device. Thus, component mounting can be implemented with higher density. The "circuit element" refers to a circuit component such as a semiconductor chip, a resistor, or a capacitor.

The insulator layer may be composed of an organic material as an essential ingredient. The phrase "as an essential ingredient" refers to that an inorganic material such as a glass fiber may be contained for improving strength and thermal conductivity.

The circuit element may be mounted on the recess. High density mounting can be implemented by mounting the circuit element on the recess. The circuit element embedded in the insulator layer cannot be changed after assembly. However, when a chip resistor or a chip capacitor is mounted on the recess, the circuit constant can be changed after assembly. Thus, the circuit constant can be improved, and further the yield can be improved. Moreover, when a semiconductor chip is mounted, the resistance and the capacitance values of the resistor and the capacitor formed on the semiconductor chip can be adjusted by trimming.

The circuit element embedded in the insulator layer may be electrically connected to a wiring pattern on the wiring conductor layer by a via plug, and the circuit element mounted on the recess may be electrically connected to the wiring pattern on the wiring conductor layer by solder or a wire.

The recess may be formed such that the depth thereof is the same as the depth of one of the wiring conductor layers for enabling the wiring pattern formed in the wiring conductor layer to be trimmed from outside. By trimming the wiring pattern from the recess, the circuit characteristics can be adjusted after assembly. Thus, the circuit characteristics can be improved, and further the yield can be improved.

The recess may be sealed with a resin. Upon completion of the adjustment of the circuit element mounted on the recess and the trimming of the wiring pattern, the circuit element can be protected by sealing the recess with a mold resin or the like.

Another aspect of the present invention is a semiconductor device. The semiconductor device comprises: a laminated substrate formed by laminating insulator layers and wiring conductor layers wherein a plurality of recesses formed in the insulator layer located on one surface side of the laminated substrate; and a circuit element embedded in at least one of the insulator layers which is different from the insulator layer in which the recesses are formed. In this device, each of bottoms of the plurality of recesses reaches one of the wiring conductor layers.

By forming the recesses having different depths which are determined in accordance with the height of the circuit element mounted on the recess, high density mounting can be suitably implemented. Further, the trimming of each of the wiring patterns formed in different wiring conductor layers can be performed independently.

Yet another aspect of the present invention is a semiconductor device. The semiconductor device comprises: a laminated substrate comprising a plurality of insulator layers and a plurality of wiring conductor layers; and a plurality of circuit elements embedded in at least one of the insulator layers, wherein: the insulator layer in which the plurality of circuit elements are embedded has the wiring conductor layer thereinside; and a wiring pattern is formed by utilizing a spacing portion between the plurality of circuit elements.

According to this aspect, high density wiring can be implemented by effectively utilizing the space around a semiconductor chip or a chip component.

Still another aspect of the present invention is a semiconductor device. The semiconductor device comprises: a base; a laminated substrate formed on the base by laminating a plurality of insulator layers and a plurality of wiring conductor layers; and a plurality of circuit elements embedded in the insulator layer adjacent to the base of the laminated substrate, wherein: the insulator layer in which the plurality of circuit elements are embedded has the wiring conductor layer thereinside; and a wiring pattern is formed by utilizing a spacing portion between the plurality of circuit elements.

According to this aspect, high density wiring can be implemented by effectively utilizing the space around a semiconductor chip or a chip component.

Another aspect of the present invention is a method for manufacturing a semiconductor device. The manufacturing method comprises: mounting a plurality of circuit elements on a base; forming an insulator layer having a thickness smaller than that of the circuit element in a spacing portion between the plurality of circuit elements; and forming a wiring pattern on the insulator layer.

Yet another aspect of the present invention is a method for manufacturing a semiconductor device. The manufacturing method comprises: mounting a plurality of circuit elements on a base; pressure-bonding onto the base a first insulating film having an aperture formed in advance in a position corresponding to a spacing portion between the plurality of circuit elements; forming in the aperture a second insulating film thinner than the first insulating film; and forming a wiring pattern on the second insulating film.

Still another aspect of the present invention is a method for manufacturing a semiconductor device. The manufacturing method comprises: mounting a plurality of circuit elements on a base; pressure-bonding a first insulating film onto the base from above the plurality of circuit elements; forming an aperture in a spacing portion in the first insulating film and between the circuit elements; forming in the aperture a second insulating film thinner than the first insulating film; and forming a wiring pattern on the second insulating film.

According to the manufacturing methods of the above aspects, a wiring pattern can be suitably formed in the spacing portion between a plurality of circuit elements.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several figures, in which:

FIGS. 4A to 4H are sectional views illustrating a part of the manufacturing processes of the semiconductor device shown in FIG. 3;

FIGS. 5A to 5C are sectional views illustrating a part of the manufacturing processes of the semiconductor device shown in FIG. 3; and FIGS. 6A to 6F are sectional views illustrating a part of the manufacturing processes of the semiconductor device shown in FIG. 3.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

Figure 1:
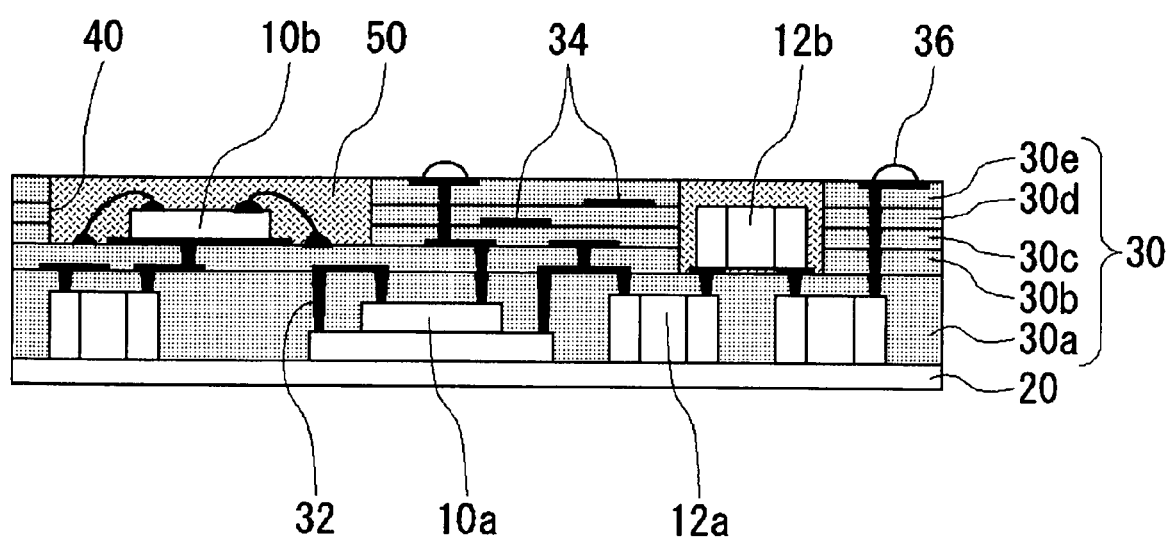
FIG. 1 is a sectional view of a semiconductor device according to a first embodiment of the invention.

FIG. 1 is a sectional view of a semiconductor device 100 according to a first embodiment of the present invention. In subsequent figures, the same reference numerals are used to denote the same components, and the description thereof will be omitted as appropriate.

The semiconductor device 100 comprises a base 20, semiconductor chips 10a and 10b, chip components 12a and 12b, an insulating base 30, wiring patterns 34, via plugs 32, an external lead-out electrode 36, a recess 40, and a resin 50. In FIG. 1, for convenience, the downward direction is defined as a direction from the surface on which the recess 40 is provided toward the surface on which the base 20 is provided, and the upward direction is defined as the direction from the surface on which the base 20 is provided toward the surface on which the recess 40 is provided.

The insulating base 30 is formed on the base 20, and the semiconductor chips 10a and 10b and the chip components 12a and 12b are embedded in the insulating base 30. These are connected to each other by the wiring patterns 34 and the via plugs 32 to form an electronic circuit.

The insulating base 30 has a multi-layer structure formed by laminating a plurality of insulator layers 30a to 30e. These insulator layers may be composed of the same material or each composed of different materials. A wiring conductor layer is provided between each of the adjacent insulator layers 30a to 30c, and the wiring pattern 34 is formed in the wiring conductor layer. The wiring pattern 34 may be formed as an inductor or a capacitor, in addition to the wiring which connects the devices to each other.

The semiconductor chips 10a and 10b are, for example, an IC chip on which transistors, diodes, and passive components are integrated, and are an integrated circuit formed on a semiconductor such as silicon, silicon germanium, or gallium arsenide. Specifically, the chip components 12a and 12b are a capacitor, an inductor, a resistor, or the like. The semiconductor chip 10a and the chip component 12a are mounted on the base 20 and embedded in the insulator layer 30a.

The via plugs 32 are provided for electrically connecting the wiring patterns 34 in the different wiring conductor layers. Further, the semiconductor chip 10a and the chip component 12a embedded in the insulator layer 30a are electrically connected to the wiring patterns 34 by the via plugs 32.

The recess 40 is formed on the upper surface of the insulating base 30 such that one of the wiring conductor layers serves as the bottom surface of the recess 40. When the semiconductor device 100 is viewed from above, the wiring pattern 34 is exposed on the bottom of the recess 40. Each of the semiconductor chip 10b and the chip component 12b is die-bonded or wire-bonded, or mounted by soldering to the exposed wiring pattern 34 for physically and electrically connecting to the wiring pattern 34. The recess 40 is sealed by the resin 50.

The external lead-out electrode 36 is provided on the upper surface of the semiconductor device 100 and serves as an I/O terminal for receiving power supplied from outside or for inputting and outputting a signal. The external lead-out electrode 36 may be provided on the lower surface of the semiconductor device 100. In this case, a via plug is provided in the base 20 for pulling out a signal line to the lower surface.

In the semiconductor device 100 according to this embodiment of the present invention, a mounting surface for mounting various components can be added by forming the recess 40 on the surface of the semiconductor device 100, and thus component mounting can be implemented with higher density.

The resistor and the capacitor formed in the semiconductor chip 10b mounted on the recess 40 can be trimmed if a sealing step by use of the resin 50 has not been performed. Thus, the circuit characteristics can be adjusted even after the assembly of the semiconductor device 100, thus the yield can be improved.

When the chip component 12b such as a chip resistor or a chip capacitor is mounted on the recess 40, the circuit constant can be changed by replacing the chip component 12b if the sealing step by use of the resin 50 has not been performed. Thus, the circuit characteristics, the yield, and the like can be improved.

Further, when the wiring pattern 34 formed on the wiring conductor layer in the insulating base 30 is exposed from the recess 40, the circuit constant can also be changed by trimming the wiring pattern.

Part of the heat generated by the semiconductor chip is dissipated to the outside via the external lead-out electrode 36. Thus, if, as in this embodiment, the recess 40 is formed on the same surface as the surface on which the external lead-out electrode 36 is formed, the distance between the semiconductor chip and the external electrode becomes smaller by mounting on the recess the semiconductor chip generating a large amount of heat, thereby resulting in an advantage in heat dissipation. This effect is significant particularly when a material having a low thermal conductivity is employed for the insulator layer.

Next, a method for manufacturing the semiconductor device 100 according to this embodiment will be described. FIGS. 2A to 2I are sectional views illustrating the manufacturing processes of the semiconductor device 100 of FIG. 1.

First, as shown in FIG. 2A, a die-chip bonding process of fixing a plurality of circuit elements such as the semiconductor chip 10a and the chip component 12a on the base 20 is performed. The base 20 may be a tape base having an adhesive property and capable of fixing the semiconductor chip 10a and the chip component 12a on its surface. A heat conduction material such as a resin film or an aluminum plate may be employed as the material for the base 20. Alternatively, organic materials such as epoxy resins, melamine derivatives such as BT resin, liquid crystal polymers, PPE resins, polyimide resins, fluorocarbon resins, phenol resins, melamine derivatives such as BT resin, and polyamide bismaleimide may be employed. The details of some of the materials will be given hereinafter.

In this embodiment, a stretchable material may be employed as the base 20. For example, a PET film may be employed as such a material. Alternatively, a UV photoreactive film may be employed as the base 20. For example, an adhesive tape of a type which changes adhesion when UV light is irradiated may be employed as the UV photoreactive film. This adhesive tape is commercially available and is used as a supporting body when a semiconductor (a chip) is cut.

When a stretchable material is employed as the base 20, the base 20 is first stretched in the lateral direction in the figure, and then a plurality of the semiconductor chips 10a and a plurality of the chip components 12a are fixed to the base 20.

Subsequently, as shown in FIG. 2B, a conductive film-affixed insulative resin film 124, which is formed by affixing a conductive film 120 to an insulative resin film 122, is affixed to the base 20. The conductive film-affixed insulative resin film 124 is then pressure-bonded to the base 20 by means of a vacuum press. The conductive film-affixed insulative resin film 124 is, for example, a resin film with a copper foil.

Therefore, the semiconductor chips 10a and the chip components 12a are pressed into the insulative resin film 122. The conductive film 120 serves as a wiring conductor layer, and the wiring pattern is formed therein in the subsequent step.

In this embodiment, when the semiconductor chips 10a and the chip components 12a are pressed into the insulative resin film 122 while the base 20 to which the semiconductor chips 10a and chip components 12a are fixed is held stretched, the space between the elements is expanded. Thus, upon pressing the semiconductor chips 10a and the chip components 12a into the insulative resin film 122, the elements are smoothly pressed into the insulative resin film 122. Therefore, an excellent adhesion property can be obtained between the semiconductor chips 10a and the insulative resin film 122 and between the chip components 12a and the insulative resin film 122.

On the other hand, when the semiconductor chips 10a and the chip components 12a are pressed into the insulative resin film 122 while the base 20 is held contracted, the space between the elements is narrowed, thereby enabling the elements to be arranged with high density.

Further, even if the plurality of semiconductor chips 10a and the plurality of chip components 12a have a step, the thickness from the base 20 to the conductive film 120 can be made constant since the insulative resin film fills on the semiconductor chips 10a and the chip components 12a. Therefore, the dimensional accuracy of the semiconductor device 100 can be improved.

The conductive film 120 is, for example, a rolled metal such as a rolled copper foil. Any material can be employed as the insulative resin film 122 so long as the material is softened by heating. Examples of the material include organic materials such as epoxy resins, melamine derivatives such as BT resin, liquid crystal polymers, PPE resins, polyimide resins, fluorocarbon resins, phenol resins, melamine derivatives such as BT resin, and polyamide bismaleimide. By employing such a material, the stiffness of the circuit device can be improved, and the stability of the circuit device can be enhanced.

Examples of the epoxy resins include melamine, melamine cyanurate, methylolated melamine, (iso)cyanurate, melam, melem, melon, succinoguanamine, melamine sulfate, acetoguanamine sulfate, melam sulfate, guanyl melamine sulfate, melamine resin, BT resin, cyanuric acid, isocyanuric acid, isocyanuric derivatives, melamine derivatives such as melamine isocyanurate, benzoguanamine, and acetoguanamine, and guanidine compounds.

Examples of the liquid crystal polymers include aromatic liquid crystal polyesters, polyimide, polyester amide, and resin compositions containing such polymers. Of these, liquid crystal polyesters or compositions containing the liquid crystal polyesters are preferable since these are well balanced in heat resistance, workability, and hygroscopicity.

Examples of the liquid crystal polyesters include: (1) ones obtained from the reaction of aromatic dicarboxylic acid, aromatic diol, and aromatic hydroxycarboxylic acid; (2) ones obtained from the reaction of a combination of different types of aromatic hydroxycarboxylic acids; (3) ones obtained from the reaction of aromatic dicarboxylic acid and aromatic diol; and (4) ones obtained from the reaction of polyesters such as polyethylene terephthalate with aromatic hydroxycarboxylic acid. In place of the above aromatic dicarboxylic acid, aromatic diol, and aromatic hydroxy carboxylic acid, the ester derivatives thereof may be employed. In addition, the above aromatic dicarboxylic acid, aromatic diol, and aromatic hydroxy carboxylic acid having the aromatic group substituted with a halogen atom, an alkyl group, an aryl group, or the like may be employed.

In addition, the insulative resin film 122 may contain fillers such as fibers. For example, granular or fibrous $SiO_2$ or SiN may be employed as the filler. By incorporating fillers such as fibers into the insulative resin film 122, the warpage of the insulative resin film 122 can be reduced during cooling the insulative resin film 122 to, for example, room temperature after the insulative resin film 122 is heated and the semiconductor chips 10a and the chip components 12a are thermal-pressure-bonded thereto. In this case, the thermal conductivity is also improved. In this manner, the adhesion property between the semiconductor chip 10a and the insulative resin film 122 and between the chip component 12a and the insulative resin film 122 can be improved. When fiber is incorporated into the insulative resin film 122, the stiffness thereof can be improved, thereby facilitating handling. From this view point, if an aramid nonwoven fabric is employed as a material composing the insulative resin film 122, the workability can be improved since the fluidity of the resin becomes higher than that of the fiber.

A film formed by affixing the conductive film 120 on the insulative resin film 122 may be employed as the conductive film-affixed insulative resin film 124. The conductive film-affixed insulative resin film 124 may be formed by applying a resin composition composing the insulative resin film 122 on the conductive film 120 and then drying the resin composition. In this embodiment, the resin composition may contain a curing agent, a curing promoter, and other ingredients so long as the object of the present invention can be attained. The conductive film-affixed insulative resin film 124 is disposed on the base 20 while the insulative resin film 122 is in the B-stage which refers to a primary cured, semi-cured, or temporarily cured state.

In this manner, the adhesion property between the insulative resin film 122 and the semiconductor chip 10a and between the insulative resin film 122 and the chip component 12a can be improved. Subsequently, the insulative resin film 122 is heated in a manner determined by the type of the resin composing the insulative resin film 122, and the conductive film-affixed insulative resin film 124 is pressure-bonded to the semiconductor chips 10a and the chip components 12a under vacuum or reduced pressure. In another example, the insulating resin film 122 in the B-stage is disposed on the base 20, and the conductive film 120 is placed thereon. Upon pressure-bonding the insulative resin film 122 to the semiconductor chips 10a and the chip components 12a, the conductive film 120 can also be pressure-bonded to the insulative resin film 122 to form the conductive film-affixed insulative resin film 124.

Subsequently, as shown in FIG. 2C, a wiring patterning process of forming wiring in the conductive layer 120 is performed by means of a laser direct imaging method (trepanning alignment) or wet copper etching to thereby form the wiring pattern 34.

Subsequently, as shown in FIG. 2D, a via hole forming process of forming a via hole (a through hole) in the insulative resin film 122 is performed by means of a combination of a carbon dioxide gas laser, a YAG laser, and dry etching.

Next, as shown in FIG. 2E, a plating process of forming a conductive film by means of electroless copper plating and electrolytic copper plating which are applicable to a high aspect ratio object and forming the via plug 32 by filling a conductive material into the through hole is performed.

The details of the formation of the via plug 32 will next be described. A through hole 128 is formed in the insulator layer by means of a combination of a carbon dioxide gas laser, a YAG laser, dry etching, and the like. Subsequently, a thin film having a thickness of about 0.5 to 1 μm is formed over the entire through hole 128 by means of electroless copper plating, and then a film having a thickness of about 20 μm is formed by means of electrolytic plating. Normally, palladium is employed for the catalyst for the electroless plating. In order to deposit the electroless plating catalyst to the flexible insulating base, an aqueous solution containing palladium as a complex is prepared, and the flexible insulating base is dipped thereinto to thereby deposit the palladium complex on the surface. While this state is maintained, cores for initiating plating can be formed on the surface of the flexible insulating base by reducing the palladium complex to metal palladium by use of a reducing agent.

A filler material may be filled into the via plug 32 in accordance with need. Various materials including insulative materials, conductive materials, and the like may be employed as the filler material. Alternatively, copper may be filled as the filler material by means of plating or other method.

Subsequently, the processes of laminating the conductive film-affixed insulative resin film 124, forming the wiring pattern 34 on the conductive film 120, and connecting the wiring patterns 34 by the via plug 32 are repeatedly performed to thereby form the insulating base 30 composed of the laminated insulator layers 30a to 30b (FIG. 2F).

Subsequently, as shown in FIG. 2G, the recess 40 is provided on the upper surface of the insulating base 30. The recess 40 may be formed by machine processing by use of a drill. Alternatively, the recess 40 may be formed by means of laser processing, etching, or a combination thereof. The recess 40 reaches down to any one of the wiring conductor layers, causing a wiring pattern 34b formed on the wiring conductor layer to be exposed.

Subsequently, the semiconductor chip 10b or the chip component 12b is mounted inside the recess 40. The semiconductor chip 10b is die-bonded by use of silver paste or the like and wire-bonded by use of a gold wire or the like for physically and electrically connecting to the wiring pattern 34b. In addition, the chip component 12b is physically and electrically connected to the wiring pattern 34b by means of soldering.

Subsequently, an external lead-out electrode (not shown) is formed for performing an inspection process in accordance with need. If the properties obtained by the inspection are not desirable, the trimming of the semiconductor chip 10b, the replacement of the chip component 12b, or the like may be performed.

Subsequently, the resin 50 is potted into the recess 40 for sealing the semiconductor chip 10b and the chip component 12b.

The semiconductor device 100 according to the first embodiment can be manufactured through the above-described processes.

Second Embodiment

Figure 3:
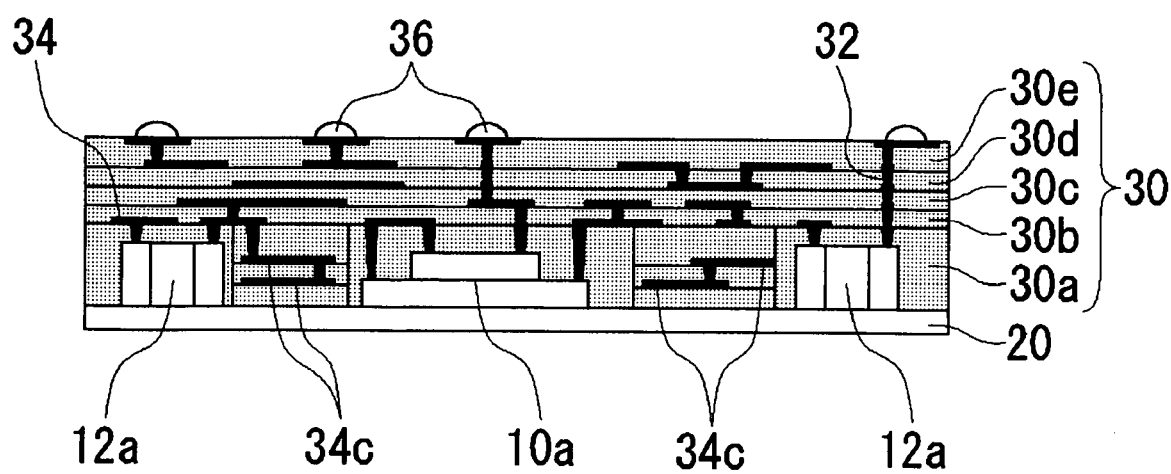
FIG. 3 is a sectional view of a semiconductor device according to a second embodiment of the invention.

A semiconductor device 200 according to a second embodiment will be described with attention to the differences with the above-described semiconductor device 100. FIG. 3 is a sectional view illustrating the semiconductor device 200 according to the second embodiment.

The semiconductor device 200 comprises a base 20, a semiconductor chip 10a, chip components 12a, an insulating base 30, wiring patterns 34, via plugs 32, and external lead-out electrodes 36. Also in FIG. 3, the downward direction is defined as the direction from the surface on which the external lead-out electrode 36 is provided toward the base 20, and the upward direction is defined as the direction from the base 20 toward the surface on which the external lead-out electrode 36 is provided, for convenience.

The insulating base 30 has a multi-layer structure formed by laminating a plurality of insulator layers 30a to 30e. As in the semiconductor device 100 shown in FIG. 1, the semiconductor chip 10a and the chip components 12a are embedded in the insulator layer 30a adjacent to the base 20, and the connection between the members is provided by the via plugs 32 and the wiring patterns 34 to thereby form the circuit.

In the semiconductor device 200 of FIG. 3, wiring patterns 34c are provided in the spacing portions between or around the semiconductor chip 10a and the chip components 12a.

The thickness of the semiconductor chip 10a is normally 100 to 300 µm, and the height of the chip component 12a such as a resistor or a capacitor is about 300 µm for a so-called 0603 size component and about 500 µm for a 1005 size component. In this embodiment, a wiring conductor layer is also formed in the spacing portions on which the semiconductor chip 10a or other component is not mounted, thereby implementing higher density wiring.

According to the semiconductor device 200, high density wiring can be implemented by effectively utilizing the space around the semiconductor chip or the chip component, and thus the flexibility of wiring design can be improved.

A manufacturing method for the semiconductor device 200 according to the second embodiment will be described. FIGS. 4A to 4H are sectional views illustrating part of the manufacturing processes of the semiconductor device 200 shown in FIG. 3.

FIG. 4A illustrates a state in which the semiconductor chip 10a and the chip components 12a are die-bonded and chip-bonded to the base 20 and are embedded in an insulative resin film 122. The processes shown in FIGS. 2A and 2B can be followed for obtaining the state shown in FIG. 4A. A conductive film 120 may be or may not be affixed to the insulative resin film 122.

Next, as shown in FIG. 4B, apertures 150 are formed in the insulative resin film 122. The apertures 150 are formed in the spacing portions between the semiconductor chip 10a and the chip components 12a and in which the wiring patterns 34c shown in FIG. 3 are to be formed. The apertures 150 are formed by means of, for example, a drill, laser processing, etching, or a combination thereof.

As shown in FIG. 4C, insulator layers 130a are formed in the respective apertures 150 formed in the insulative resin film 122 in the above process. This insulator layer 130a may be formed by means of resin potting or the like. As in the insulative resin film 122, a resin softened by heating may be employed as the resin for potting. Examples of the material include organic materials such as epoxy resins, melamine derivatives such as BT resin, liquid crystal polymers, PPE resins, polyimide resins, fluorocarbon resins, phenol resins, melamine derivatives such as BT resin, and polyamide bis-maleimide.

Subsequently, as shown in FIG. 4D, the wiring patterns 34c are formed on the insulator layers 130a. The wiring patterns 34c may be formed by means of, for example, a combination of an electroless plating method and etching. Similarly, as shown in FIG. 4E, the resin potting is repeated to laminate an insulator layer 130b, and the wiring pattern 34c is formed thereon.

Subsequently, as shown in FIG. 4F, via holes are formed in the insulator layer 130b by means of laser irradiation or the like, and the wiring patterns 34c are electrically connected by via plugs 32 (FIG. 4G).

Figure 2:
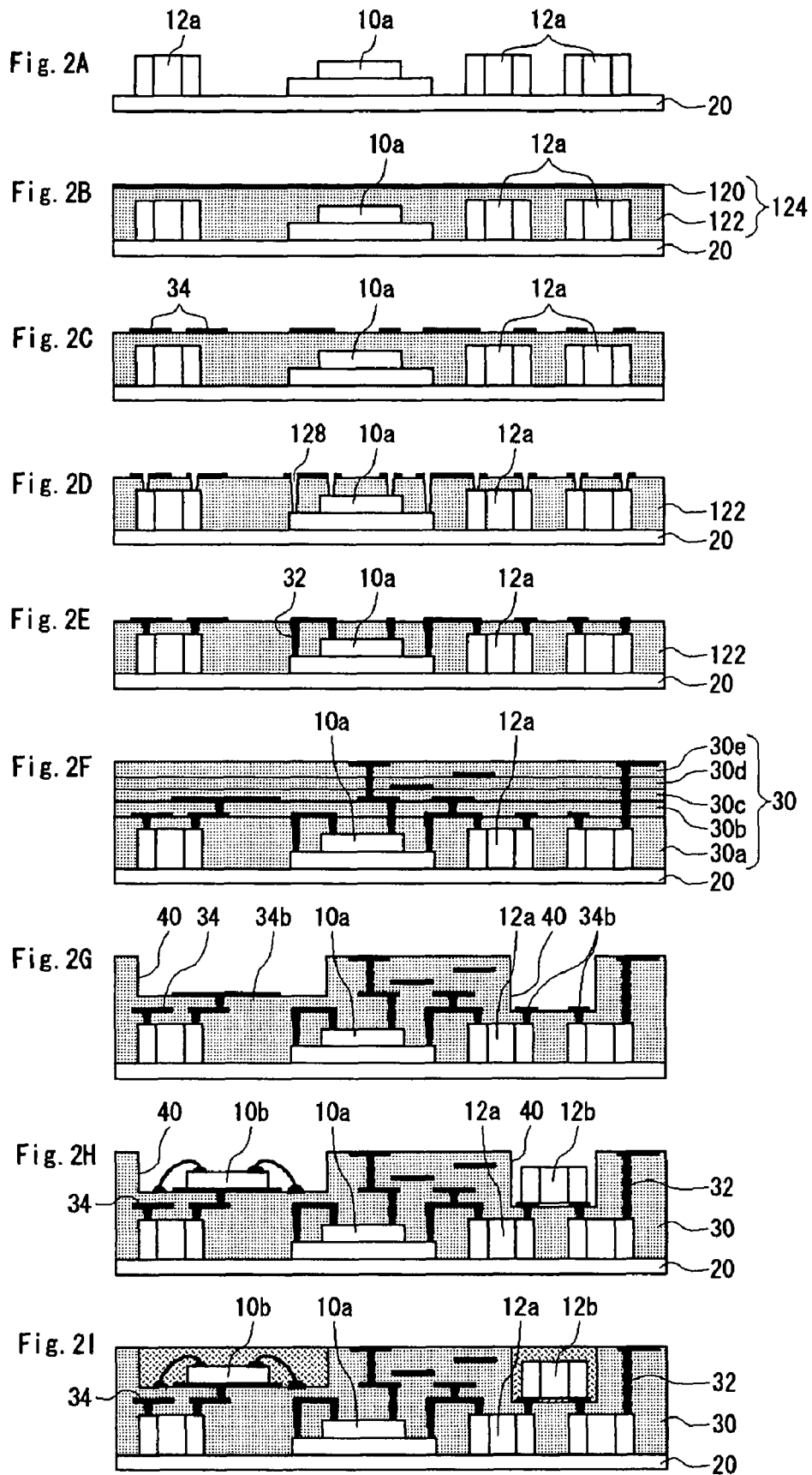
FIGS. 2A to 2I are sectional views illustrating the manufacturing processes of the semiconductor device shown in FIG. 1.

Subsequently, insulator layers 130c are formed by means of resin potting to thereby form a plurality of wiring conductor layers in the insulative resin film 122. The same processes as in FIG. 2 are followed for subsequent processes. The insulator layer 130c may be formed by pressing from above an insulative resin film covering the entire semiconductor device 200 which is in the state shown in FIG. 4G.

By the above manufacturing method, the wiring patterns can be formed in the spacing portions between a plurality of semiconductor chips 10a and chip components 12a. Therefore, the space in the semiconductor device 200 can be effectively utilized, thereby implementing wiring with higher density.

The processes shown in FIGS. 4A to 4B may be performed by the processes shown in FIGS. 5A to 5C. As shown in FIG. 5A, the semiconductor chip 10a and the chip components 12a are die-bonded and chip-bonded to the base 20. Subsequently, the insulative resin film 122 having the apertures 150 formed in advance is affixed to the base 20, and the semiconductor chip 10a and the chip components 12a are pressed into the insulative resin film 122 by means of vacuum press, as shown in FIGS. 5B and 5C.

The apertures 150 in the insulative resin film 122 are provided in positions in which the respective wiring patterns 34c are to be formed.

The wiring patterns 34c may be formed by means of the processes shown in FIGS. 6A to 6F.

First, as shown in FIG. 6A, the semiconductor chip 10a and the chip components 12a are die-bonded and chip-bonded to the substrate 20. Subsequently, as shown in FIG. 6B, a resin is locally potted to positions in which the wiring patterns 34c are to be formed, thereby forming the insulator layers 130a. Next, the wiring patterns 34c and the insulator layers 130b are formed, and then the respective via plugs 32 are formed, as shown in FIGS. 6C to 6E.

Subsequently, as shown in FIG. 6F, the insulative resin film 122 is affixed to the base 20, and the semiconductor chip 10a and the chip components 12a are pressed into the insulative resin film 122 by means of vacuum press.

In this manner, the wiring patterns 34c may also be formed in the spacing portions between a plurality of semiconductor chips 10a and chip components 12a. Therefore, high density wiring can be implemented by effectively utilizing the space in the semiconductor device 200.

The present invention is not limited to the foregoing embodiments, and various types of modifications including design changes may be made thereto based on the knowledge of those who skilled in the art. All such modified embodiments are also intended to fall within the scope of the present invention.

In the embodiments, the description has been made on the semiconductor devices in which semiconductor chips and chip components are mounted together. But the present invention is not limited thereto and is applicable to various semiconductor devices on which a semiconductor chip is mounted.

In the first embodiment, a single circuit element such as a semiconductor chip or a chip component may be mounted on one recess 40, or a plurality of the circuit elements may be mounted thereon. The number of the circuit elements may be appropriately determined in accordance with the size of the recess.

In the above embodiments, the semiconductor chip 10 and the chip components 12 are mounted on the base 20. But the present invention is applicable to an ISB (Integrated System in Board, registered trademark) known as a coreless SIP (System In Package) which has a wiring pattern made of copper or the like but does not employ a core for supporting semiconductor circuit elements.

While the preferred embodiments of the present invention have been described using specific terms, such description is for illustrative purposes only, and it is to be understood that changes and variations may be made without departing from the spirit or scope of the appended claims.

What is claimed is:

1. A circuit device comprising:
    a base on which a plurality of first circuit elements is fixed, the plurality of first circuit elements having different heights;
    a first insulative film formed on the base, the plurality of first circuit elements being embedded in the first insulative film;
    a first wiring conductor layer comprising a conductive film arranged on the first insulative film so that the thickness from the base to the conductive film is constant, the first wiring conductor layer connecting the plurality of first circuit elements to each other;
    a multi-layered structure having a plurality of laminated components on the first insulative film and the first wiring conductor layer, each of the plurality of laminated components comprising a second wiring conductor layer and a second insulative film that is thinner than the first insulative film;
    a recess arranged in the second insulative film, the recess reaching the first or the second wiring conductor layer; and
    a second circuit element mounted in the recess, the second circuit element being connected to the first or the second wiring conductor layer, wherein
    the plurality of first circuit elements comprise a semiconductor chip and at least one of a chip resistor, a chip capacitor, and a chip inductor, and
    the at least one of the chip resistor, chip capacitor, and chip inductor is in chip form to be mounted on the base.

2. The circuit device according to claim 1, wherein the recess is sealed by a resin that covers the second circuit element.

3. The circuit device according to claim 2, wherein the second circuit element is selected from the group consisting of semiconductor chips, chip resistors, chip capacitors, and chip inductors, and
    the chip resistors, chip capacitors, and chip inductors are in chip form to be mounted in the recess.

4. The circuit device according to claim 3, wherein the first insulative film or the second insulative film comprises an organic material as an essential ingredient.

5. The circuit device according to claim 3, wherein the plurality of first circuit elements are in direct contact with and mounted on the base.

6. The circuit device according to claim 3, wherein upper and side surfaces of the plurality of first circuit elements are encircled by the first insulative film.

7. The circuit device according to claim 2, wherein the first insulative film or the second insulative film comprises an organic material as an essential ingredient.

8. The circuit device according to claim 1, wherein the second circuit element is selected from the group consisting of semiconductor chips, chip resistors, chip capacitors, and chip inductors, and
    the chip resistors, chip capacitors, and chip inductors are in chip form to be mounted in the recess.

9. The circuit device according to claim 8, wherein the first insulative film or the second insulative film comprises an organic material as an essential ingredient.

10. The circuit device according to claim 1, wherein the first insulative film or the second insulative film comprises an organic material as an essential ingredient.

* * * * *